US009125330B2

(12) United States Patent
Su et al.

(10) Patent No.: US 9,125,330 B2
(45) Date of Patent: Sep. 1, 2015

(54) PIN STRUCTURE AND PIN CONNECTION STRUCTURE THEREOF

(75) Inventors: Fei Su, Xiamen (CN); Meifang Lan, Xiamen (CN); Hao Wei, Longyan (CN); Jiantong Chen, Xiamen (CN); Yufang Xiong, Xiamen (CN); Yicong Su, Zhangzhou (CN)

(73) Assignee: TPK Touch Systems (Xiamen) Inc., Xiamen (CN)

( * ) Notice: Subject to any disclaimer, the term of this patent is extended or adjusted under 35 U.S.C. 154(b) by 0 days.

(21) Appl. No.: 13/479,283

(22) Filed: May 24, 2012

(65) Prior Publication Data

US 2013/0115818 A1    May 9, 2013

(30) Foreign Application Priority Data

Nov. 5, 2011    (CN) .......................... 2011 1 0352905

(51) Int. Cl.
*H01R 4/58* (2006.01)
*H05K 3/32* (2006.01)
*H05K 1/11* (2006.01)
*H05K 3/36* (2006.01)

(52) U.S. Cl.
CPC ................. *H05K 3/323* (2013.01); *H05K 1/11* (2013.01); *H05K 3/361* (2013.01); *H05K 2201/09663* (2013.01)

(58) Field of Classification Search
CPC .. H01R 13/2414; H01R 23/722; H01R 9/096; H01L 23/49827; H05K 3/325
USPC .............................................. 439/91, 66, 591
See application file for complete search history.

(56) References Cited

U.S. PATENT DOCUMENTS

| 4,770,641 | A | * | 9/1988 | Rowlette | 439/86 |
| 5,019,944 | A | * | 5/1991 | Ishii et al. | 361/783 |
| 5,819,406 | A | * | 10/1998 | Yoshizawa et al. | 29/877 |
| 5,967,804 | A | * | 10/1999 | Yoshizawa et al. | 439/91 |
| 6,332,786 | B1 | * | 12/2001 | Suga et al. | 439/91 |
| 6,427,323 | B2 | * | 8/2002 | Appelt et al. | 29/830 |
| 6,509,634 | B1 | * | 1/2003 | Lee et al. | 257/678 |
| 6,512,184 | B1 | * | 1/2003 | Yamada et al. | 174/259 |
| 7,160,123 | B2 | * | 1/2007 | Yamada et al. | 439/91 |
| 7,384,280 | B2 | * | 6/2008 | Yamada et al. | 439/91 |
| 7,887,899 | B2 | * | 2/2011 | Fujita et al. | 428/137 |

(Continued)

FOREIGN PATENT DOCUMENTS

JP    1981153783 A    11/1981

*Primary Examiner* — Abdullah Riyami
*Assistant Examiner* — Vladimir Imas
(74) *Attorney, Agent, or Firm* — Gokalp Bayramoglu

(57) ABSTRACT

The present disclosure relates to a conductive connection structure, and more particularly to a pin structure and pin connection structure thereof. The pin structure is disposed at least one side of an anisotropic conductive film. A plurality of conductive particles is distributed over the interior of the anisotropic conductive film. The pin structure comprises: a plurality of columns which are interspaced, wherein, the conductive particles are in the periphery of the columns. The pin structure and pin connection structure provided by the present disclosure use a pin structure comprising a plurality of columns which are interspaced. When the anisotropic conductive film is used to laminate pin structures, spacing between adjacent columns can contain the conductive particles so as to reduce the number of conductive particle that flow between the left-and-right adjacent pin structures, thereby reducing incidence of short circuit of the left-and-right adjacent pin structures.

18 Claims, 8 Drawing Sheets

(56) References Cited

U.S. PATENT DOCUMENTS

| | | | |
|---|---|---|---|
| 7,931,476 B2* | 4/2011 | Russell | 439/66 |
| 7,932,607 B2* | 4/2011 | Uang et al. | 257/774 |
| 7,935,892 B2* | 5/2011 | Nishikawa et al. | 174/260 |
| 8,066,517 B2* | 11/2011 | Russell | 439/66 |
| 8,124,885 B2* | 2/2012 | Yamada et al. | 174/265 |
| 8,134,444 B2* | 3/2012 | Horiuchi et al. | 336/221 |
| 8,403,681 B2* | 3/2013 | Chien et al. | 439/66 |
| 2009/0133900 A1* | 5/2009 | Nishikawa et al. | 174/250 |

* cited by examiner

PIN STRUCTURE AND PIN CONNECTION STRUCTURE THEREOF

This application claims the benefit of the People's Republic of China Application No. 201110352905.1, filed on Nov. 5, 2011.

BACKGROUND OF THE INVENTION

1. Field of the Invention

The present disclosure relates to a conductive connection structure. More particularly, the present disclosure relates to a pin structure and pin connection structure thereof.

2. Description of the Related Art

In today's rapidly changing information age, electronic products have been bound up with people's life and work. With focus on weight, miniaturization, precision, and portability of electronic products, components that are tumble to utilize high temperature Pb—Sn for welding for circuits or pin connections of flexible printed circuit (FPC), integrated circuit (IC), liquid crystal display (LCD), and touch panel etc., an anisotropic conductive material and a related pin connecting method thereof have been gradually explored for solving various circuit connecting problem of the electronic products.

An anisotropic conductive film (ACF) is formed by evenly distributing a large amount of micro-conductive particles over the interior of an insulating adhesive material, and then making a plurality of conductive particles produce a conductive effect only in a compressive direction and not produce any conductive effect in a non-compressive direction through a heating and pressurizing process.

With reference to FIG. 1 and FIG. 2 simultaneously, FIG. 1 shows a stereoscopic diagram of a conventional pin connection structure, FIG. 2 shows a schematic diagram of a known pin connection structure before assembling. As shown in FIG. 1 and FIG. 2, a pin connection structure 9 comprises an anisotropic conductive film 93, a first connecting part 91 and a second connecting part 92. The anisotropic conductive film 93 comprises an insulating adhesive material 932 and a plurality of conductive particles 931, wherein the anisotropic conductive film 93 is disposed between the first connecting part 91 and the second connecting part 92. A plurality of first pin structures 916 are disposed beneath the first connecting part 91, wherein each first pin structure 916 transmits electrical signals through a first conducting wire 911. A plurality of second pin structures 926 are disposed above the second connecting part 92, wherein each second pin structure 926 transmits electrical signals through a second conducting wire 921. The anisotropic conductive film 93 is disposed between the plurality of first pin structures 916 and the plurality of second pin structures 926.

With reference to FIG. 3 simultaneously with FIG. 1 and FIG. 2, FIG. 3 shows a schematic diagram of a conventional pin connection structure after assembling. As shown in FIG. 3, the anisotropic conductive film 93 is arranged between the first connecting part 91 and the second connecting part 92, which are vertically clamped, heated and pressurized. The anisotropic conductive film 93 connects the first pin structure 916 to the corresponding second pin structure 926 when affected by temperature and pressure. After assembling of the pin connection structure 9 is completed, the anisotropic conductive film 93 can have a conductive effect in a vertical direction, and not have any conductive effect in a horizontal direction. The anisotropic conductive film 93 can transmit electrical current between the first pin structure 916 and the second pin structure 926 that are corresponding to each other. Therefore, the first conducting wire 911 and the second conducting wire 921 that are corresponding to each other can conduct with each other through the first pin structure 916 and the second pin structure 926, which are adjacent to each other. Meanwhile, the plurality of first pin structures 916 that are horizontally adjacent to each other would not have any electrical conduction between them and the same would also hold be applicable for the plurality of second pin structures 926 that are horizontally adjacent to each other.

Although the anisotropic conductive film 93 has some application advantages, since the distance between the connecting conductive circuit thereof and the first pin structure 916 or the second pin structure 926 is relatively small, when the anisotropic conductive film 93 is being heated and pressurized, a plurality of conductive particles 931 may be extruded into a gap between horizontally adjacent first pin structures 916, thereby causing a short circuit between horizontally adjacent first pin structures 916. Certainly, similar problems can also appear between the pluralities of horizontally adjacent second pin structures 926.

Therefore, how to overcome the foregoing problems is an objective that those skills in the art are endeavoring for.

SUMMARY OF THE INVENTION

An objective of the present disclosure is to employ a pin structure comprising a plurality of columns, which are interspaced to make the spacing between adjacent columns contain conductive particles when the anisotropic conductive film is used for laminating, thereby reducing numbers of conductive particles that flow between horizontally adjacent pin structures and also reducing incidence of short circuit of the horizontally adjacent pin structures.

In order to achieve the above objective, the present disclosure provides a pin structure disposed on one side of an anisotropic conductive film. A plurality of conductive particles are distributed over the interior of the anisotropic conductive film, wherein the pin structure comprises a plurality of columns which are interspaced, and the conductive particles are in the periphery of the columns.

In order to achieve above objective, the present disclosure also provides a pin connection structure comprising a first connecting part, a second connecting part, and an anisotropic conductive film. The first connecting part comprises a plurality of first pin structures, wherein at least one first pin structure comprises a plurality of first columns which are interspaced. The second connecting part comprises a plurality of second pin structures, and each second pin structure is corresponding to a plurality of first columns of a first pin structure. A plurality of conductive particles are distributed over the interior of the anisotropic conductive film, and the anisotropic conductive film is disposed between the first pin structure and the second pin structure for connecting and conducting the corresponding first pin structure and second pin structure.

Accordingly, the present disclosure describes a pin structure and a pin connection structure employing the pin structure. The pin structure comprises a plurality of columns which are interspaced to make the spacing between adjacent columns contain conductive particles when an anisotropic conductive film is used for laminating, thereby reducing the number of conductive particles that flow between adjacent pin structures and also reducing incidence of short circuit of the plurality of adjacent pin structures.

In order to further understand characteristics and technical aspects of the present disclosure, several descriptions accompanied with drawings are described in detail below. However, accompanying drawings are for purposes of reference and specification only, not for limiting the present disclosure.

DETAILED DESCRIPTION OF THE EMBODIMENTS

First Embodiment

Figure 1:
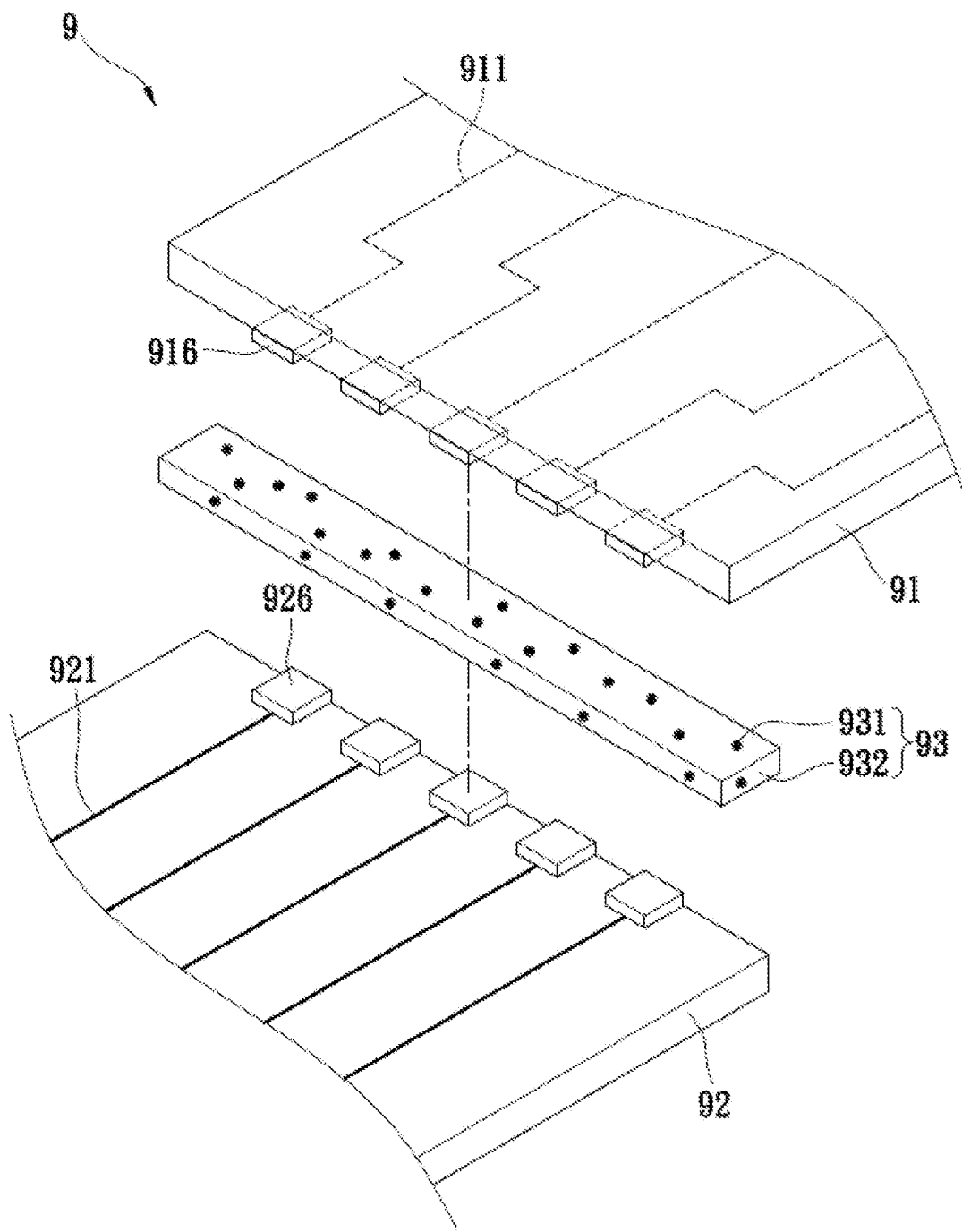
FIG. 1 is a stereoscopic diagram of a conventional pin connection structure.
Figure 2:
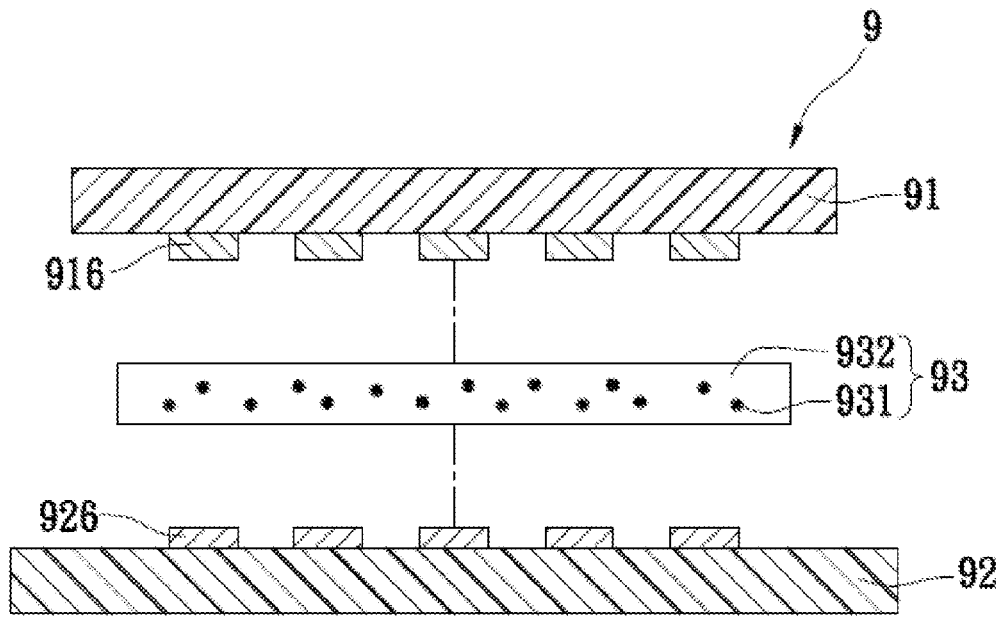
FIG. 2 is a schematic diagram of a conventional pin connection structure before assembling.
Figure 3:
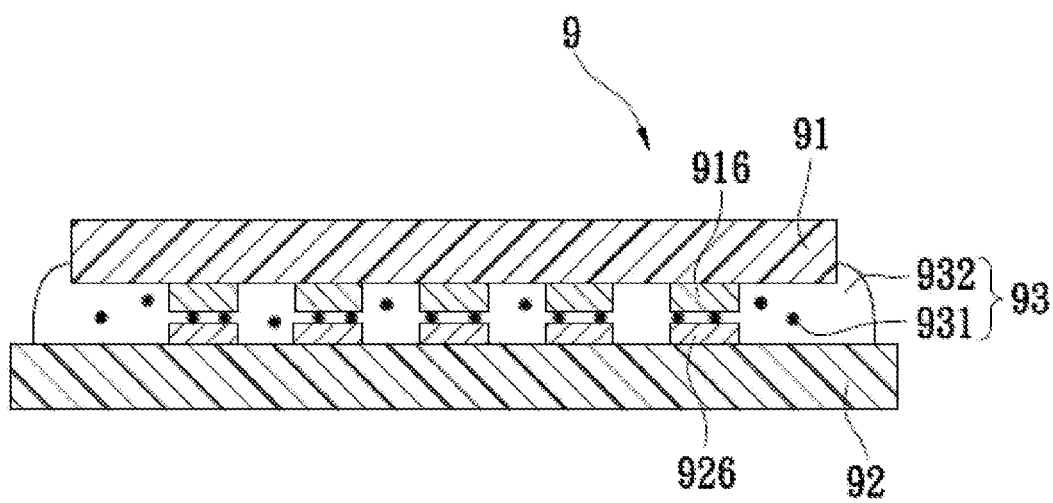
FIG. 3 is a schematic diagram of a conventional pin connection structure after assembling.
Figure 4:
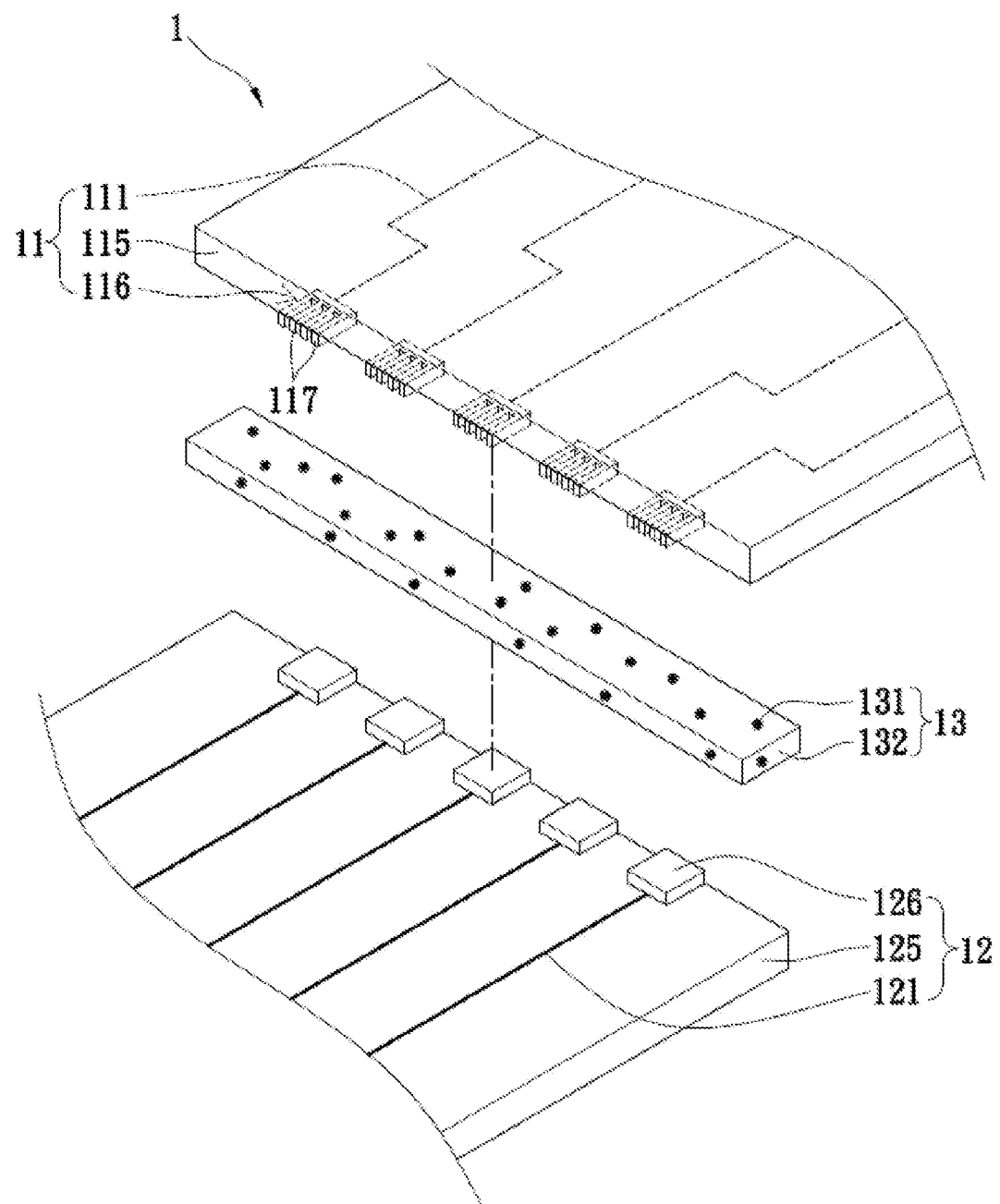
FIG. 4 is a stereoscopic diagram of a pin connection structure in accordance with a first embodiment of the present disclosure.

FIG. 4 is a stereoscopic diagram of a pin connection structure in accordance with the first embodiment of the present disclosure. As shown in FIG. 4, a pin connection structure 1 comprises an anisotropic conductive film (ACF) 13, a first connecting part 11, and a second connecting part 12. A plurality of pin structures are disposed on the pin connection structure 1, wherein at least one pin structure comprises a plurality of columns, which are interspaced. The pin structure can be disposed on the first connecting part 11 and/or the second connecting part 12. To be easily distinguished and identified hereafter, "pin structure" and "column" on the first connecting part 11 are named as first pin structure 116 and first column 117. Similarly, "pin structure" and "column" on the second connecting part 12 are named as second pin structure 126 and second column 127.

In other words, a plurality of first pin structures 116 on the first connecting part 11 are disposed on one side of the anisotropic conductive film 13, wherein the anisotropic conductive film 13 comprises an insulating adhesive material 132 and a plurality of conductive particles 131. The conductive particles 131 are distributed over the interior of the insulating adhesive material 132 of the anisotropic conductive film 13. At least one first pin structure 116 comprises a plurality of first columns 117, which are interspaced. In an embodiment, the first pin structures 116 can be connected to another conductor for lamination and electrical conduction through the anisotropic conductive film 13.

Figure 5:
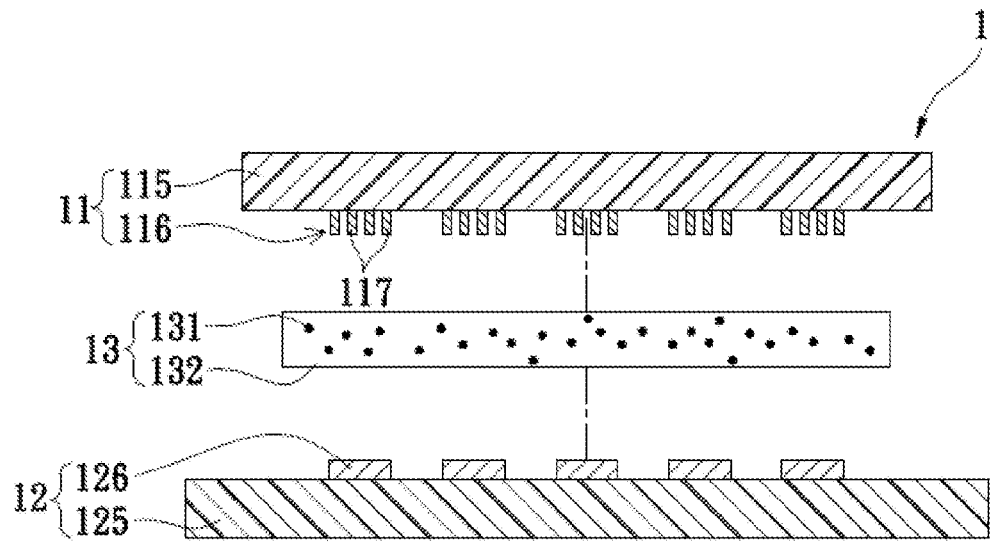
FIG. 5 is a schematic diagram of a pin connection structure before assembling in accordance with the first embodiment of the present disclosure.

FIG. 5 is a schematic diagram of a pin connection structure before assembling in accordance with the first embodiment of the present disclosure. Aforesaid pin structure can be used in a pin structure 1. As shown in FIG. 4 and FIG. 5, the first connecting part 11 of the pin connection structure 1 comprises a plurality of first pin structures 116. Moreover, at least one first pin structure 116 comprises a plurality of first columns 117 which are interspaced, and the second connecting part 12 of the pin connection structure 1 comprises a plurality of second pin structures 126, and each second pin structure 126 is corresponding to a plurality of first columns 117 of the first pin structure 116. The anisotropic conductive film 13 is arranged between the first pin structure 116 and the second pin structure 126 for connecting and conducting the adjacent first pin structure 116 and second pin structure 126.

The first connecting part 11 further comprises a first plate 115 and a plurality of first conducting wires 111. The first pin structure 116 are disposed on the underside of the first plate 115 side by side, and each first pin structure 116 transmits electrical signals through a first conducting wire 111. The second connecting part 12 further comprises a second plate 125 and a plurality of second conducting wires 121. The second pin structure 126 are disposed on the upside of the second plate 125 side by side, the upside of the second plate 125 is disposed correspondingly to the underside of the first plate 115. The anisotropic conductive film 13 is arranged between the underside of the first plate 115 and the upside of the second plate 125. Each second pin structure 126 transmits electrical signals through a second conducting wire 121. In an embodiment of the present disclosure, the first connecting part 11 can be a touch panel, and the second connecting part 12 can be a flexible printed circuit (FPC) connected to a controller (not shown). Signal transmission can be performed between the touch panel and the controller through the pin connection structure 1.

Further, as shown in FIG. 5, the first pin structure 116 comprises a plurality of first columns 117, wherein the first columns 117 are adjacently juxtaposed in a comb-like or indented conformation, but not limited to those shapes. Each second pin structure 126 is corresponding to a plurality of first columns 117 of a first pin structure 116. The first columns 117 can be rectangular or parallelogrammical column, but not limited to those shapes.

In the embodiment of the present disclosure, the plurality of first pin structures 116 of the first connecting part 11 and the plurality of second pin structures 126 of the second connecting part 12 can be disposed at equal intervals. The plurality of first columns 117 of the first pin structure 116 are adjacently juxtaposed on a same horizontal line, and sizes and conformations of the plurality of the first columns 117 of the same first pin structure 116 are same. Certainly, the plurality of first pin structures 116 of the first connecting part 11 can also be disposed at unequal intervals. Alternatively, the plurality of first pin structures 116 can be disposed at unequal heights. Similarly, the plurality of second pin structures 126 of the second connecting part 12 can also be disposed at unequal intervals. Alternatively, the plurality of second pin structures 126 can be disposed at unequal heights. Therefore, the first connecting part 11 and the second connecting part 12 can be more flexible in the structural designs for applying to different functions of software and hardware, or assembled into different types of chips or electronic components. In addition, the plurality of first columns 117 can also be designed as different size, different length, different thickness, and different distances same as that in the pin structure 116.

Figure 6:
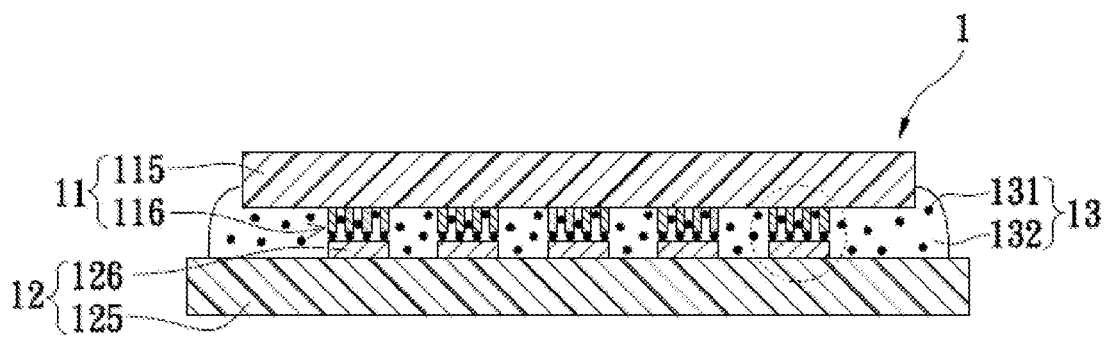
FIG. 6 is a schematic diagram of a pin connection structure after assembling in accordance with the first embodiment of the present disclosure.
Figure 7:
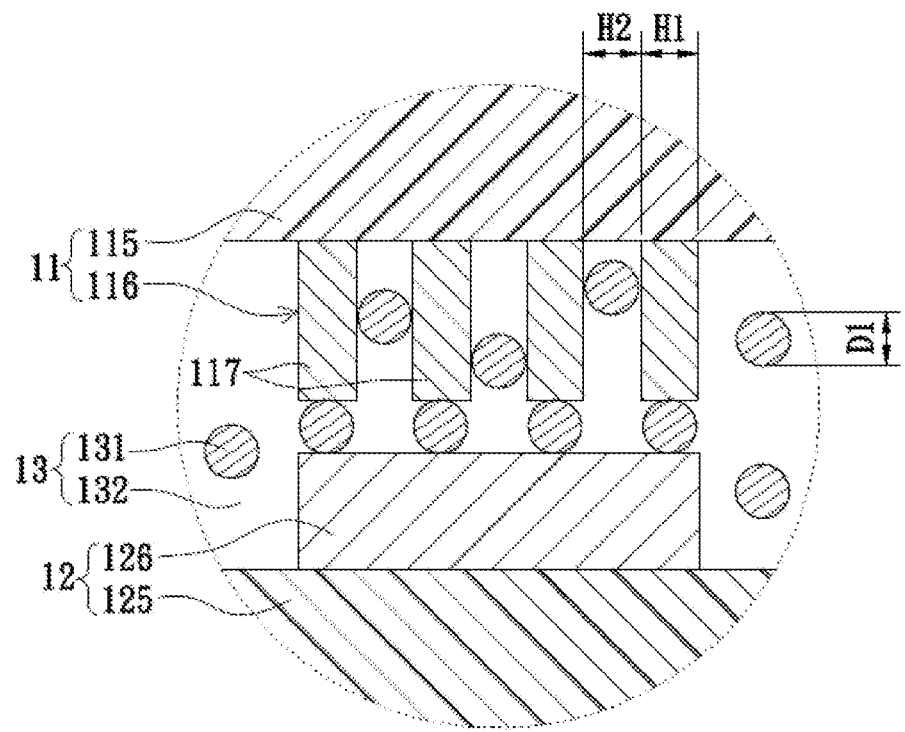
FIG. 7 is a partial enlargement diagram of FIG. 6.

With reference to FIG. 6 and FIG. 7 simultaneously, FIG. 6 is a schematic diagram of a pin connection structure after assembling, in accordance with the first embodiment of the present disclosure, and FIG. 7 is a partial enlargement diagram of FIG. 6. As shown in FIG. 6 and FIG. 7, when assembling, each first pin structure 116 is corresponding to a second pin structure 126 as a vertically corresponding state. The anisotropic conductive film 13 is arranged between the first plate 115 of the first connecting part 11 and the second plate 125 of the second connecting part 12, wherein the first connecting part 11 and the second connecting part 12 are closed to each other, clamped, heated and pressurized in a vertical direction. Accordingly, the first connecting part 11 and the second connecting part 12 are laminated with each other through the anisotropic conductive film 13. After assembling the first connecting part 11 and the second connecting part 12, as shown in FIG. 7, the insulating adhesive material 132 and the conductive particles 131 are evenly distributed between the first pin structure 116 and the second pin structure 126. Moreover, the first columns 117 have a horizontal width (H1). The horizontal width (H1) is a horizontal intercept of the side view diagram of the first column 117 as FIG. 7. A spacing (H2) is delimited between two adjacent first columns 117. Horizontal width (H1) of the first column 117 is equal to diameter (D1) of the conductive particle 131 and the spacing (H2) between two first columns 117 is equal to the diameter (D1) of the conductive particle 131. Therefore, after being heated and pressurized, the spacing (H2) between adjacent first columns 117 can contain the conductive particle 131 to reduce numbers of the conductive particle 131 that flow between adjacent first pin structures 116 and adjacent second pin structures 126, thereby reducing or preventing the incidence of short circuits between the plurality of adjacent first pin structures 116 and the plurality of adjacent second pin structures 126. In addition, a part of conductive particles 131 are clamped in between the first column 117 and the second pin structure 126 for transmitting electric current between the first pin structure 116 and the second pin structure 126 in a vertical direction. Hereon, functions of the insulating adhesive material 132, except insulating and containing the conductive particles 131, also comprise adhering and laminating the first connecting part 11 and the second connecting part 12.

Furthermore, the pin connection structure 1 of the present disclosure comprises a plurality of first columns 117 which are interspaced. When the anisotropic conductive film 13 is used for laminating, the anisotropic conductive film 13 is softened and deformed by temperature and pressure. The insulating adhesive material 132 and the conductive particles 131 can evenly flow into and be distributed in the spacing (H2) of the plurality of the first columns 117, so that deformation of the pin connection structure 1 can be relatively avoided, and flatness of the pin structure after lamination is improved. Furthermore, after assembling, it is observable from the spacing between adjacent first columns 117 that the contact state of the first pin structure 116 and the second pin structure 126 with the conductive particles is consistent, thereby ensuring that the first pin structure 116 and the second pin-structure 126 are vertically conducted so that the risk of disconnection is declined. Therefore, when the size of the pin connection structure 1 gets smaller with designs, above mentioned shortcomings of short circuit, disconnection, flatness and the like, do not remain, allowing the pin connection structure 1 to be applied in situations that are unable to utilize a high temperature Pb—Sn for welding, such as in circuits or pin connections of flexible printed circuit (FPC), integrated circuit (IC), liquid crystal display (LCD), touch panel etc.

Second Embodiment

Figure 8:
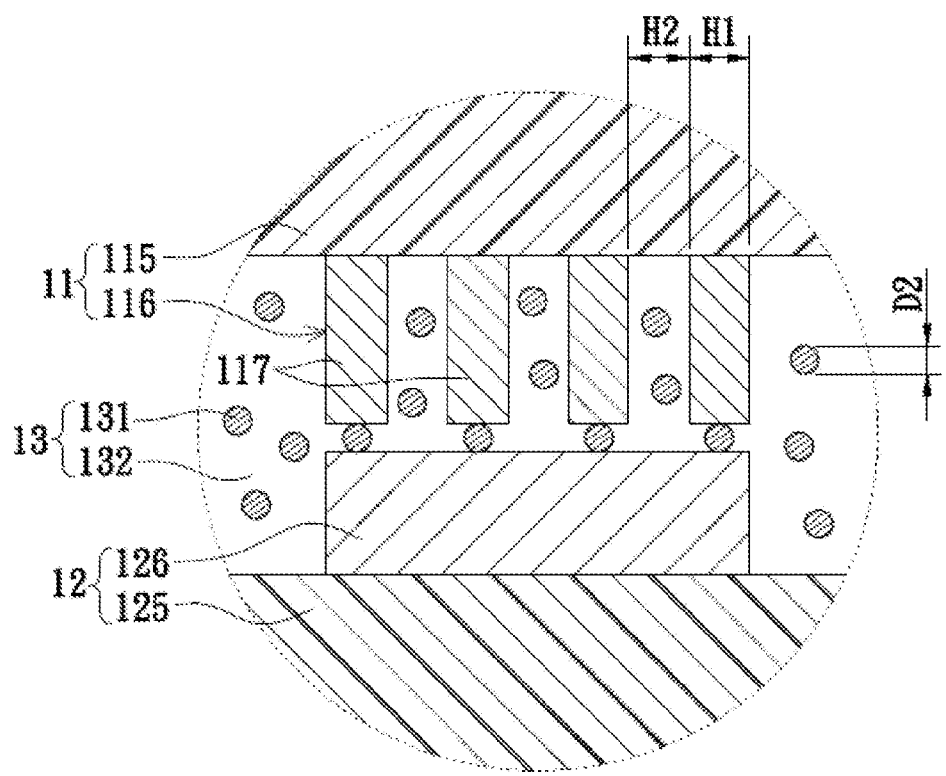
FIG. 8 is a partial enlargement diagram of a pin connection structure in accordance with a second embodiment of the present disclosure.

With reference to FIG. 8, FIG. 8 is a partial enlargement diagram of a pin connection structure in accordance with the second embodiment of the present disclosure, wherein the structures thereof similar to that of the foregoing embodiment and hence not described here again. As shown in FIG. 8, diameter (D2) of the conductive particles 131 is less than the horizontal width (H1) of the first column 117, and is also less than the spacing (H2). Therefore, each spacing (H2) can contain a plurality of conductive particles 131 simultaneously. Moreover, more conductive particles 131 can be distributed in between the first column 117 and the second pin structure 126, so that the electric current conduction of the first pin structure 116 and the second pin structure 126 is increased.

Third Embodiment

Figure 9:
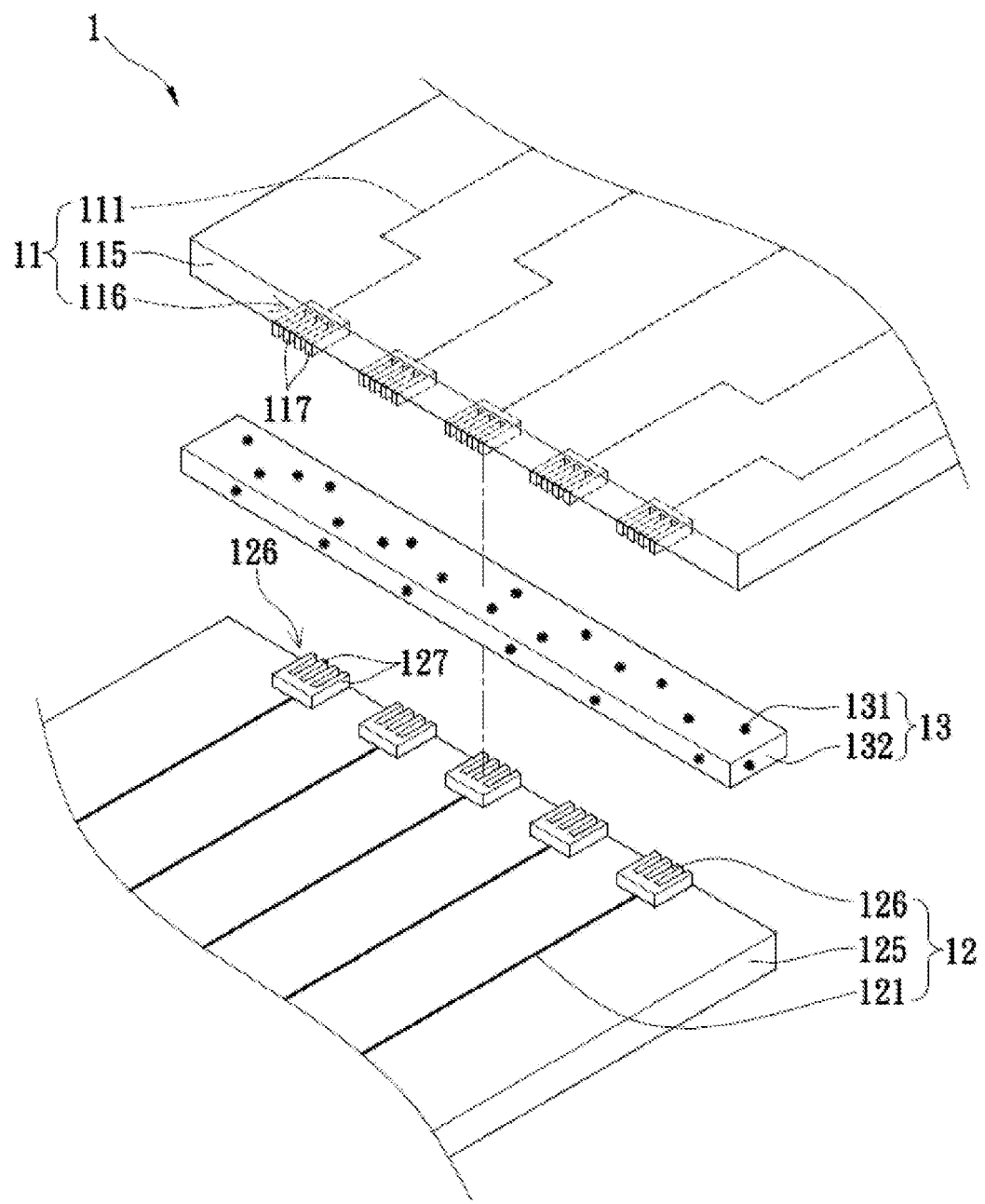
FIG. 9 is a stereoscopic diagram of a pin connection structure in accordance with a third embodiment of the present disclosure.
Figure 10:
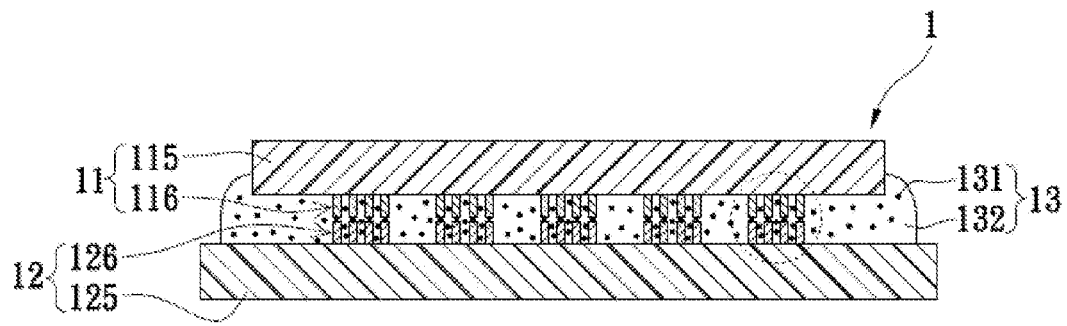
FIG. 10 is a schematic diagram of a pin connection structure after assembling in accordance with the third embodiment of the present disclosure.
Figure 11:
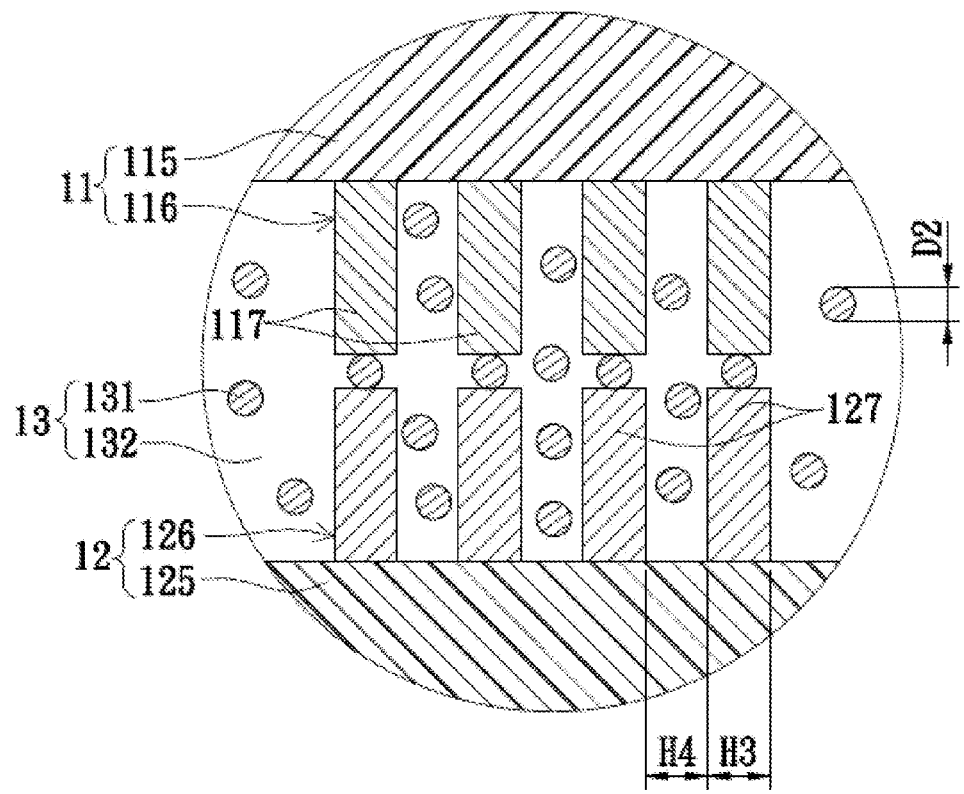
FIG. 11 is a partial enlargement diagram of FIG. 10.

With reference to FIG. 9 to FIG. 11, FIG. 9 is a stereoscopic diagram of a pin connection structure in accordance with the third embodiment of the present disclosure. FIG. 10 is a schematic diagram of a pin connection structure after being assembled in accordance with the third embodiment of the present disclosure, FIG. 11 is a partial enlargement diagram of FIG. 10, wherein the structures are similar to that of the foregoing embodiments and hence not described herein again. As shown in FIG. 9 to FIG. 11, the connecting part 12 comprises a second plate 125 and a plurality of pin structures 126, wherein each second pin structure 126 comprises a plurality of second columns 127 which are interspaced, and the second columns 127 are corresponding to the adjacent first columns 117. The plurality of second columns 127 of the second pin structure 126 can be adjacently juxtaposed on a same horizontal line in a comb-like or indented conformation. Besides, horizontal width (H3) of the second column 127 is greater than or equal to the diameter (D2) of the conductive particles 131. Adjacent second columns 127 have a spacing (H4) between themselves, wherein the spacing is greater than or equal to diameter (D2) of the conductive particles 131.

When assembling, each first pin structure 116 is corresponding to a second pin structure 126, so that each first column 117 is at least adjacent to the periphery of a second column 177, and each second column 127 is at least adjacent to the periphery of a first column 117. Namely, the first column 117 and the second column 177 are vertically corresponding and adjacent to each other. Therefore, the anisotropic conductive film 13 can be disposed between the first plate 115 and the second plate 125, and the first connecting part 11 and the second connecting part 12 are closed to each other and clamped in a vertical direction for pressurizing the anisotropic conductive film 13. After being clamped and pressurized, as shown in FIG. 11, the insulating adhesive material 132 and the conductive particle 131 can be evenly distributed between the first column 117 and the second column 127. Accordingly, not only the spacing (H2) between the adjacent first columns 117 can contain the conductive particles 131, but the spacing (H4) between the adjacent second columns 127 can also contain the conductive particles 131, so as to reduce incidence of short circuit and risk of disconnection and improve the function of flatness.

Fourth Embodiment

Figure 12:
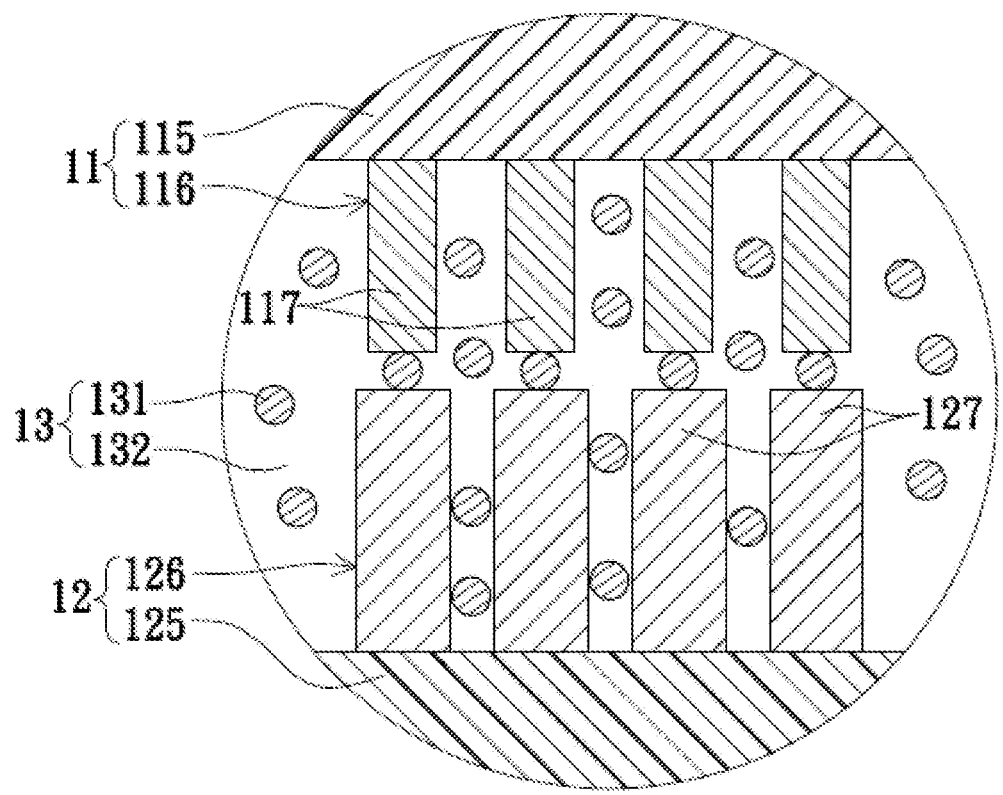
FIG. 12 is a partial enlargement diagram of a pin connection structure in accordance with a fourth embodiment of the present disclosure.

With reference to FIG. 12, FIG. 12 is a partial enlargement diagram of a pin connection structure in accordance with the fourth embodiment of the present disclosure. As shown in FIG. 12, the first pin structure 116 has a plurality of first columns 117, and the second pin structure 126 has a plurality of second columns 127, and the first pin structure 116 and the second pin structure 126 are vertically adjacent and corresponding to each other. Sizes and conformations of the first columns 117 and the second columns 127 that are adjacent and corresponding to each other, may or may not be equivalent. Non-equivalent sizes and conformations of the first columns 117 and the second columns 127 that are adjacent and corresponding to each other means that number, length, thickness, spacing, contour or shape thereof are unequal. Hereby, the present disclosure can achieve the foregoing functions.

In conclusion, the pin structure and the pin connection structure employing the pin structure of the present disclosure can be used when an anisotropic conductive film is used for laminating the spacing between adjacent columns can contain conductive particles, wherein the number of conductive particles that flow between adjacent pins is reduced, thereby reducing the incidence of short circuit of a plurality of adjacent first pin structures or of the plurality of adjacent second pin structures. Furthermore, contact state of the conductive particles and pins can be observed from the spacing between pluralities of columns of the pins, so as to reduce risk of disconnection. Since the insulating adhesive material and the conductive particles can evenly flow into and get distributed in the spacing (H2) of the plurality of first columns 117 and in the spacing (H4) of the plurality of second columns 127, the pins are not arched so as to prevent deformation, thereby improving flatness of the pins after being laminated.

While certain embodiments have been shown and described, various modifications and substitutions may be made thereto without departing from the spirit and scope of the disclosure. Therefore, it is to be understood that the present disclosure has been described by way of illustration and not limitations.

What is claimed is:

1. A pin connection structure, comprising:
   a first connecting part comprising;
      a plurality of first pill structures; and
      a plurality of first conductive wires, corresponding to the plurality of first pin structure, each of the first pin structures connecting to each of the first conductive wires respectively, wherein at least one first pin structure comprises a plurality of first columns with a spacing between the adjacent first columns capable of containing conductive particles and the plurality of first columns of the corresponding one of the first pin structures transmits electrical signals through one of the corresponding first conducting wires;
   a second connecting part comprising a plurality of second pin structures, wherein each of the second pin structures is corresponding to one of the first pin structures; and
   an anisotropic conductive film with a plurality of conductive particles distributed therein, wherein the anisotropic conductive film is disposed between the first pin structures and the second pin structures for conductively connecting the corresponding first pin structure and second pin structure.

2. The pin connection structure of claim 1, wherein at least one second pin structure comprises a plurality of second columns which are interspaced, wherein each second column is corresponding to the adjacent first column.

3. The pin connection structure of claim 2, wherein the horizontal width of the second column is substantially equal to the diameter of the conductive particle.

4. The pin connection structure of claim 2, wherein the spacing between two adjacent second columns is substantially equal to the diameter of the conductive particle.

5. The pin connection structure of claim 2, wherein the horizontal width of the first column is not equal to the horizontal width of the second column, and wherein the first column and second column are correspondingly adjacent to each other.

6. The pin connection structure of claim 1, wherein the horizontal width of the first :column is substantially equal to the diameter of the conductive particle.

7. The pin connection structure of claim 1, wherein the spacing between two adjacent first columns is substantially equal to the diameter of the conductive particle.

8. The pin connection structure of claim 1, wherein the plurality of first columns of the first pin structure are juxtaposed to each other in a comb-like or indented conformation.

9. The pin connection structure of claim 2, wherein the plurality of second columns of the second pin structure are juxtaposed to each other in a comb-like or indented conformation.

10. The pin connection structure of claim 2, wherein the first connecting part further comprises a first plate, wherein the first pin structures are adjacently disposed on the underside of the first plate, and wherein the second connecting part further comprises a second plate, wherein the upside of the second plate is disposed corresponding to the underside of the first plate, and wherein the second pin structures are adjacently disposed on the upside of the second plate.

11. The pin connection structure of claim 10, wherein the anisotropic conductive film is disposed between the underside of the first plate and the upside of the second plate.

12. The pin connection structure of claim 2, wherein the horizontal width of the second column is greater than the diameter of the conductive particle.

13. The pin connection structure of claim 2, wherein the spacing between two adjacent second columns is greater than the diameter of the conductive particle.

14. The pin connection structure of claim 1, wherein the horizontal width of the first column is greater than the diameter of the conductive particle.

15. The pin connection structure of claim 1, wherein the spacing between two adjacent first columns is greater than the diameter of the conductive particle.

16. The pin connection structure of claim 2, wherein the two adjacent second columns of the same second pin structure are electrically connected by the conductive particles in the corresponding spacing.

17. The pin connection structure of claim 2, wherein the plurality of second columns of the same second pin structure are electrically connected to each other.

18. The pin connection structure of claim 1, wherein the second connecting part further comprises a plurality of second conducting wires, wherein each second pin structure transmits electrical signals through a corresponding one of the plurality of second conducting wires.

* * * * *